United States Patent
Zheng

(10) Patent No.: US 10,823,631 B2
(45) Date of Patent: Nov. 3, 2020

(54) HIGH TEMPERATURE CAPACITIVE MEMS PRESSURE SENSOR

(71) Applicant: Rosemount Aerospace Inc., Burnsville, MN (US)

(72) Inventor: Jun Zheng, Edina, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 254 days.

(21) Appl. No.: 15/956,657

(22) Filed: Apr. 18, 2018

(65) Prior Publication Data

US 2019/0323912 A1    Oct. 24, 2019

(51) Int. Cl.
| | | |
|---|---|---|
| *G01L 19/06* | (2006.01) | |
| *B81B 7/00* | (2006.01) | |
| *B81C 1/00* | (2006.01) | |
| *G01L 9/00* | (2006.01) | |

(52) U.S. Cl.
CPC ........ *G01L 19/0681* (2013.01); *B81B 7/0019* (2013.01); *B81C 1/00158* (2013.01); *G01L 9/0048* (2013.01); *G01L 9/0073* (2013.01); *B81B 2201/0264* (2013.01); *B81B 2203/0127* (2013.01); *B81B 2203/0315* (2013.01); *B81B 2203/04* (2013.01); *B81C 2201/0132* (2013.01); *B81C 2203/031* (2013.01); *B81C 2203/036* (2013.01)

(58) Field of Classification Search
CPC ... G01L 9/0047; G01L 9/0048; G01L 9/0073; G01L 19/0681; B81B 7/19; B81B 2203/0315; B81B 2203/04; B81B 2203/0127; B81B 2201/0264; B81C 1/00158; B81C 2201/0132; B81C 2203/031; B81C 2203/036
See application file for complete search history.

(56) References Cited

U.S. PATENT DOCUMENTS

| | | | | |
|---|---|---|---|---|
| 4,581,676 | A | * | 4/1986 | Baxter ............... F27D 99/007 361/283.4 |
| 4,701,826 | A | * | 10/1987 | Mikkor ............... G01L 9/0073 361/283.4 |
| 5,286,671 | A | * | 2/1994 | Kurtz ............... H01L 21/2007 148/DIG. 12 |
| 6,704,185 | B2 | | 3/2004 | Chatzandroulis et al. |
| 7,111,518 | B1 | | 9/2006 | Allen et al. |

(Continued)

FOREIGN PATENT DOCUMENTS

| | | |
|---|---|---|
| JP | 2014071052 A | 4/2014 |
| WO | WO2012164975 A1 | 12/2012 |

OTHER PUBLICATIONS

Extended European Search Report for EP Application No. 19168341.6, dated Sep. 13, 2019, pp. 7.

*Primary Examiner* — David J Bolduc

(74) *Attorney, Agent, or Firm* — Kinney & Lange, P.A.

(57) ABSTRACT

A MEMS pressure sensor includes a first plate with a hole on a diaphragm bonded to the first plate around its rim with the diaphragm positioned over the hole. An isolation frame is bonded to the diaphragm and a second plate with a pillar is bonded to the isolation frame around its rim to form a cavity such that the end of the pillar in the cavity is proximate a surface of the diaphragm. The diaphragm and second plate form a capacitive sensor which changes output upon deflection of the diaphragm relative to the second plate.

16 Claims, 8 Drawing Sheets

(56) References Cited

U.S. PATENT DOCUMENTS

| | | | |
|---|---|---|---|
| 8,435,821 B2 | 5/2013 | Gamage et al. | |
| 8,627,559 B2 | 1/2014 | Suminto et al. | |
| 9,783,411 B1 | 10/2017 | Potasek et al. | |
| 2004/0029336 A1* | 2/2004 | Harpster | H01L 21/2007 438/202 |
| 2005/0076719 A1 | 4/2005 | Jakobsen et al. | |
| 2007/0082420 A1* | 4/2007 | Milne | B81B 3/001 438/48 |
| 2007/0289388 A1* | 12/2007 | Kurtz | G01L 9/0055 73/727 |
| 2015/0315016 A1 | 11/2015 | Yoneoka et al. | |

* cited by examiner

HIGH TEMPERATURE CAPACITIVE MEMS PRESSURE SENSOR

BACKGROUND

The present disclosure relates to a compact MEMS capacitive pressure sensor used primarily for sensing air pressures and air vehicle operations, which is constructed to provide long term stability, reduced temperature induced errors, and to provide a rugged and accurate sensing element for a pressure sensor assembly.

Solid state capacitive type pressure sensors have been well known in the art, and are widely accepted because of their ability to be miniaturized, and to be made using batch fabricating techniques to hold costs down. Such prior art sensors have used glass or semiconductor bases, and formed diaphragm layers joined together around the rim of the diaphragm with anodic bonding, glass frit bonding, metal diffusion and similar bonding techniques.

It has also been known in the art to metalize borosilicate glass (sold under the trademark Pyrex) layers for forming capacitive electrodes for use with deflecting semiconductor diaphragms. Temperature stability is a problem for pressure sensors used in air vehicles because they are subjected to wide, quite sudden swings in temperature. Temperature induced stresses caused by materials which have different temperature coefficients continues to be a problem. Sensing elements that can withstand temperature environments exceeding those in state of the art would be useful.

SUMMARY

A MEMS pressure sensor includes a backing plate with a central hole on a circular diaphragm bonded to the backing plate around its rim with the diaphragm positioned over the hole. An isolation frame is bonded to the top of the diaphragm and an electrode with a central pillar is bonded to the isolation frame around its rim to form a cavity such that the end of the pillar in the cavity is proximate the upper surface of the diaphragm. The diaphragm and electrode plate form a capacitive sensor which changes output upon deflection of the diaphragm relative to the electrode plate.

A method of forming a MEMS pressure sensor includes forming a first backing plate with a central hole and forming a diaphragm by creating a depression in the bottom side of a plate to create the diaphragm and bonding the bottom side of the diaphragm to the backing plate around its rim. The method further includes forming an isolation frame and bonding the isolation frame to the top side of the diaphragm around its rim. The method further includes forming an electrode plate with a central pillar in the bottom side of the plate and bonding the bottom side of the circular electrode plate to the top side of the isolation frame such that the end of the central pillar projects into the cavity that forms and is proximate the top side of the diaphragm to form a closed cavity. Forming a metal electrode on the outside of the diaphragm and a metal electrode on the top side of the electrode plate forms a capacitive sensor which changes output upon deflection of the top side of the diaphragm relative to the pillar on the electrode plate due to pressure differences communicated to the diaphragm through the hole in the backing plate.

DETAILED DESCRIPTION

Figure 1:
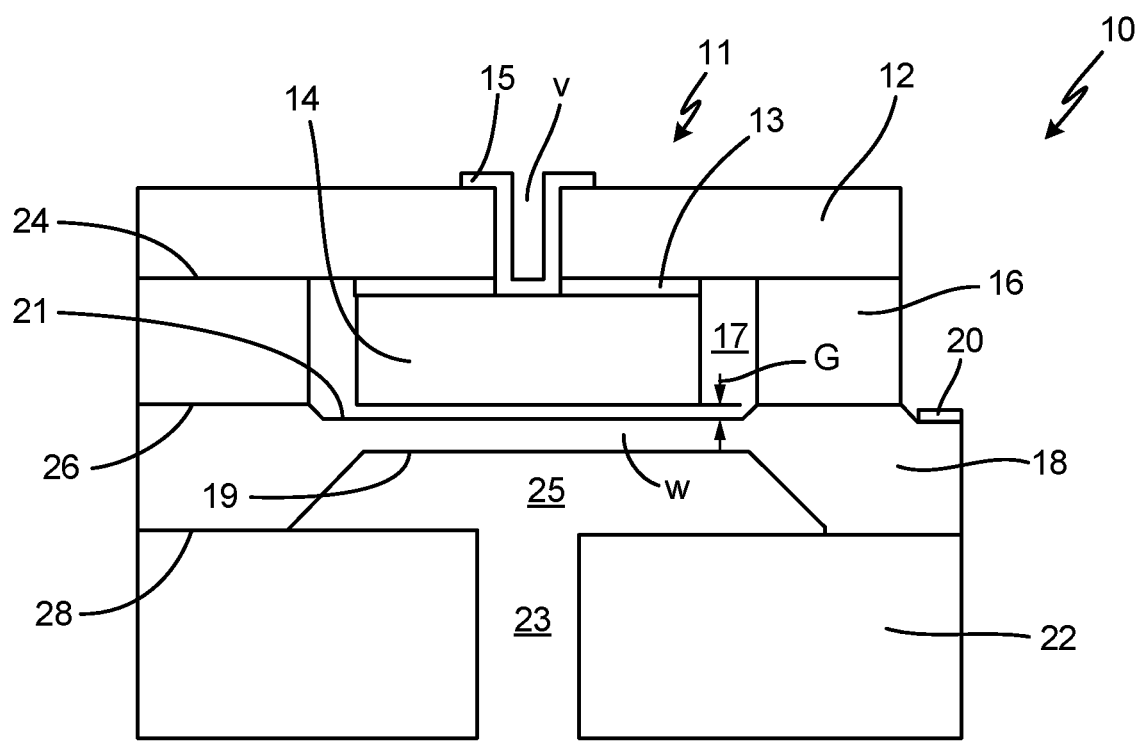
FIG. 1 is a cross-section of an embodiment of a MEMS pressure sensor.

FIG. 1 is a cross-section of an embodiment of a high temperature micro-electrical mechanical system (MEMS) pressure sensor. Pressure sensor 10 includes top electrode plate 11 formed from a silicon-on-insulator (SOI) structure comprising top silicon layer 12, oxide layer 13, and bottom silicon layer 14. Metal electrode 15 provides an electrical connection through via V to a bottom silicon layer 14. Top electrode plate 11 is bonded to quartz frame spacer 16, such as by a fusion bond for example, at interface 24. Top electrode plate 11 and quartz frame spacer 16 are bonded to silicon diaphragm 18 in a configuration such that a pillar formed by bottom silicon layer 14 on top electrode plate 11 is proximate a top surface of silicon diaphragm 18, with gap G indicating a distance between diaphragm 18 and the pillar formed by bottom silicon layer 14 on top electrode plate 11. Silicon diaphragm 18 includes first depression 19 and second depression 21 formed on respective sides. Silicon diaphragm 18 is bonded to silicon backing plate 22 to form MEMS pressure sensor 10. Metal electrode 15 on top electrode plate 11 and metal electrode 20 on silicon diaphragm 18 allow MEMS pressure sensor 10 to function as a capacitive pressure sensor which changes output upon deflection of center web W due to pressure differences communicated through hole 23 in silicon backing plate 22 and chamber 25 in silicon diaphragm 18. Silicon backing plate 22 is bonded to silicon diaphragm 18, such as by fusion bond 28 for example. Silicon diaphragm 18 is bonded to quartz frame spacer 16 by fusion bond 26. Quartz frame spacer 16 is also bonded to top electrode plate 11 by fusion bond 24. Chamber 17 may be evacuated and maintained under a vacuum. The high temperature capability of MEMS pressure sensor 10 may be achieved due to the thermal stability of the fusion bonds used to form MEMS pressure sensor 10. Metal alloys for electrodes 15 and 20 may comprise Al, Ti, Cr, TiW, and/or W alloys.

In the configuration of MEMS sensor 10 illustrated in FIG. 1, the maximum operating temperature may be about 800° C. (1472° F.).

Figure 2:
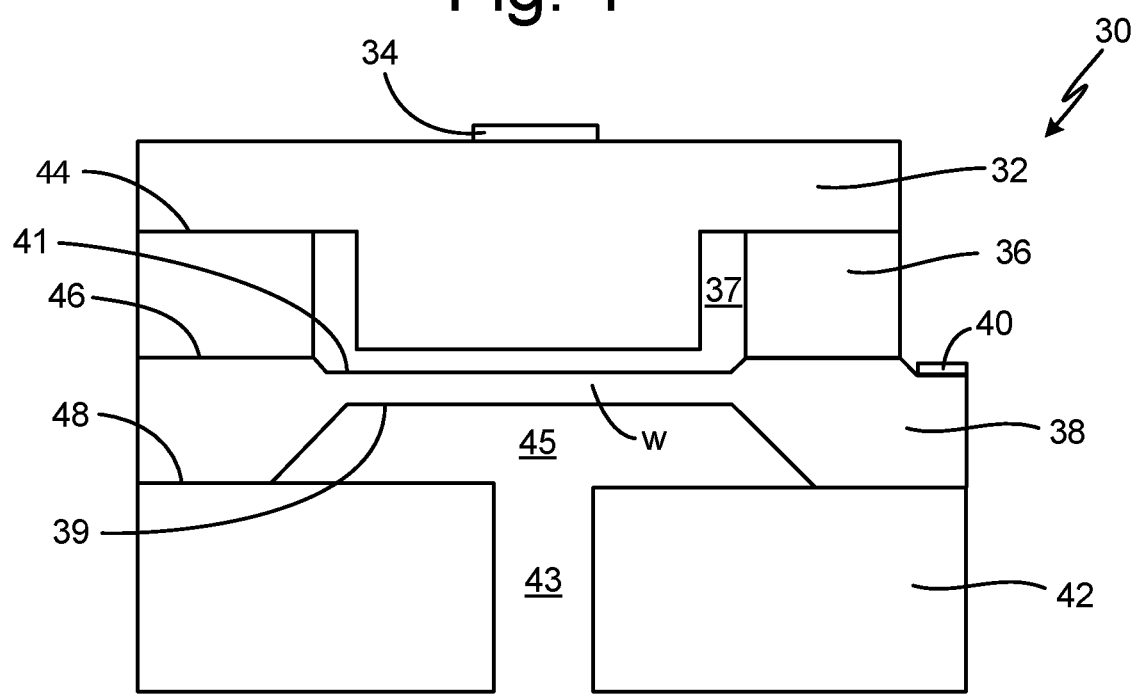
FIG. 2 is a cross-section of another embodiment of a MEMS pressure sensor.

FIG. 2 is a cross section of another embodiment of a high temperature MEMS pressure sensor. MEMS pressure sensor 30 is similar to MEMS pressure sensor 10, except that in MEMS pressure sensor 30, electrode plate 32 is formed completely from silicon instead of SOI material. Silicon electrode plate 32 with metal electrode 34 is bonded to quartz spacer frame 36, such as by fusion bond 44. Quartz spacer frame 36 is bonded to silicon diaphragm 38, such as by fusion bond 46. Silicon diaphragm 38 includes first depression 39 and second depression 41 formed on respective sides. Silicon backing plate 42 is bonded to silicon diaphragm 38, such as by fusion bond 48. Metal electrode 34 on silicon electrode plate 32 and metal electrode 40 on silicon diaphragm 38 allow MEMS pressure sensor to function as a capacitive pressure sensor, which may change output upon deflection of center web W due to pressure differences communicated through hole 43 in silicon backing plate 42 and chamber 45 in silicon diaphragm 38. Chamber 37 may be evacuated and maintained under a vacuum. The high temperature capability of MEMS pressure sensor 30 may be achieved due to the thermal stability of the fusion bonds used to form MEMS pressure sensor 30. Metal alloys for electrodes 34 and 40 may comprise Al, Ti, Cr, TiW, and/or W alloys. As in MEMS pressure sensor 10, the maximum operating temperature of MEMS pressure sensor 30 may be about 800° C. (1472° F.).

Figure 3:
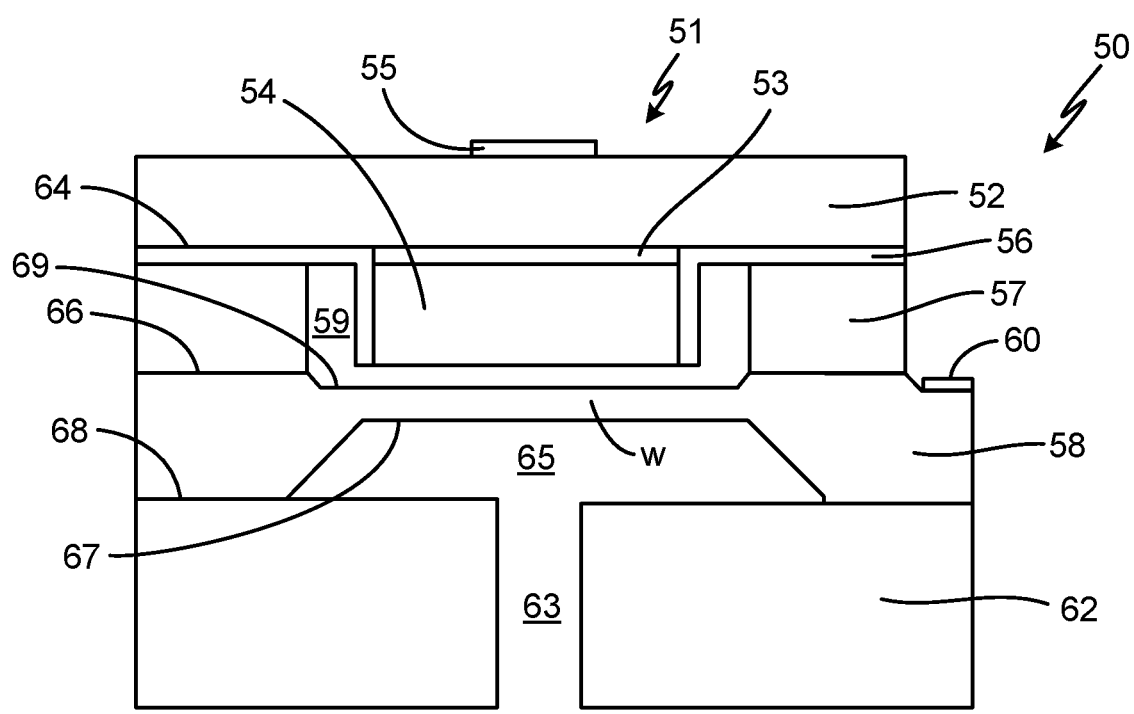
FIG. 3 is a cross-section of a further embodiment of a MEMS pressure sensor.

FIG. 3 is a cross section of a further embodiment of a high temperature MEMS pressure sensor. In this embodiment, top electrode plate 51 of MEMS pressure sensor 50 may be formed from SOI material as in MEMS pressure sensor 10 in FIG. 1. Top electrode plate 51 includes top silicon layer 52 and bottom silicon layer 54 separated by oxide layer 53. Top electrode plate 51 also includes conductive silicon layer 56 on the bottom of silicon layer 52 and sides of silicon pillar 54. Metal electrode 55 on top of silicon layer 52 is electrically connected to bottom silicon pillar 54 as a result of conductive silicon layer 56. Top silicon electrode plate 51 is bonded to quartz spacer frame 57, such as by fusion bond 64. Quartz spacer frame 57 is bonded to silicon diaphragm 58, such as by fusion bond 66. Silicon diaphragm 58 includes first depression 67 and second depression 69 formed on respective sides. Silicon backing plate 62 may be bonded to silicon diaphragm 58, such as by fusion bond 68. Metal electrode 55 on top electrode plate 51 and metal electrode 60 on diaphragm 58 allow MEMS pressure sensor to function as a capacitive pressure sensor, which may change output upon deflection of center web W due to pressure differences communicated through hole 63 in silicon backing plate 62 and chamber 65 in silicon diaphragm 58. Chamber 59 may be evacuated and maintained under vacuum. The high temperature capability of MEMS pressure sensor 50 may be achieved due to the thermal stability of the fusion bonds used to form MEMS pressure sensor 50. Metal alloys for electrodes 55 and 60 may comprise Al, Ti, Cr, TiW, and/or W alloys. As in MEMS pressure sensor 10, the maximum operating temperature of MEMS pressure sensor 50 may be about 800° C. (1472° F.).

Figure 4:
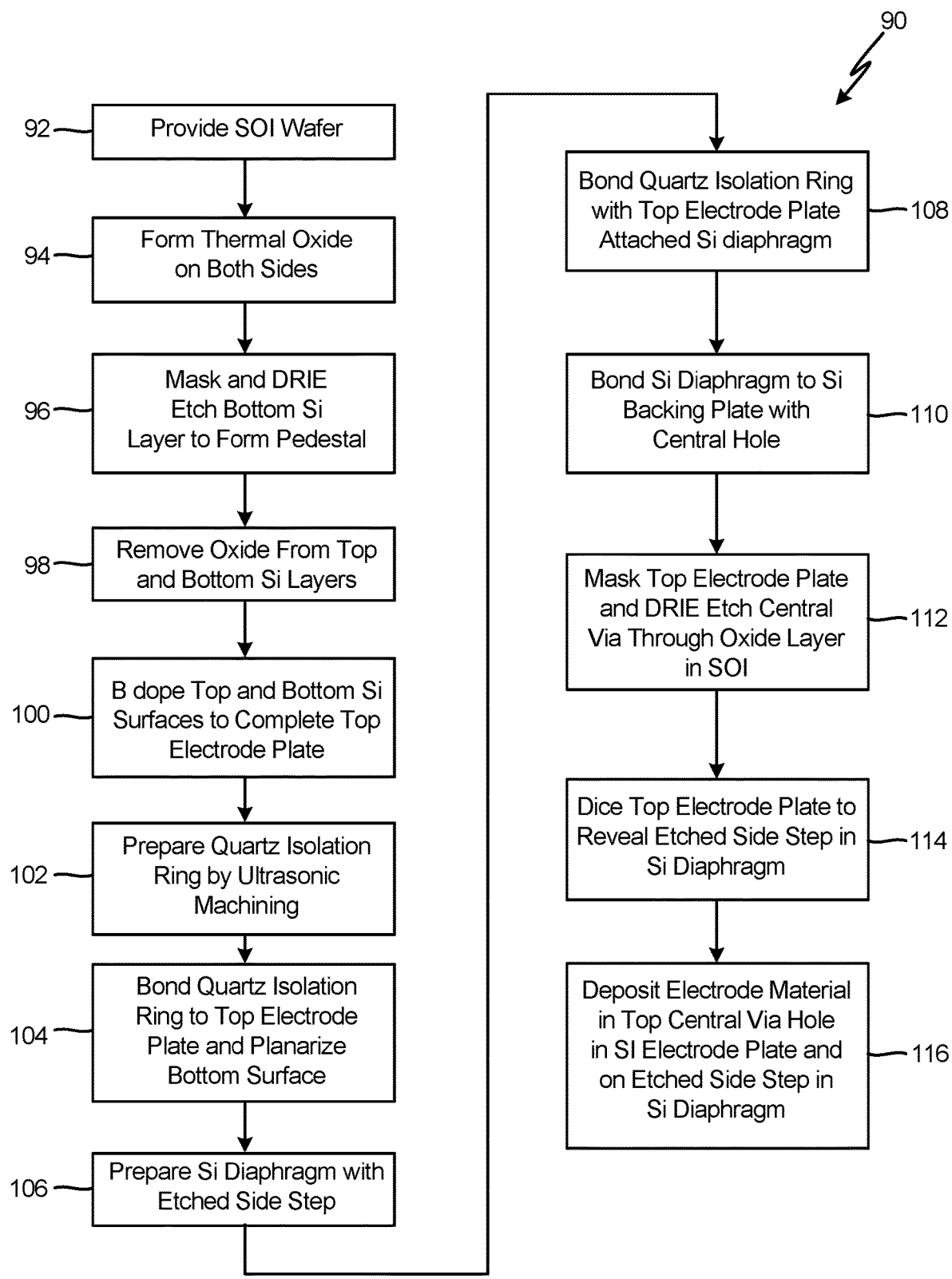
FIG. 4 is a diagram of the steps of forming a MEMS pressure sensor.
Figure 5A:
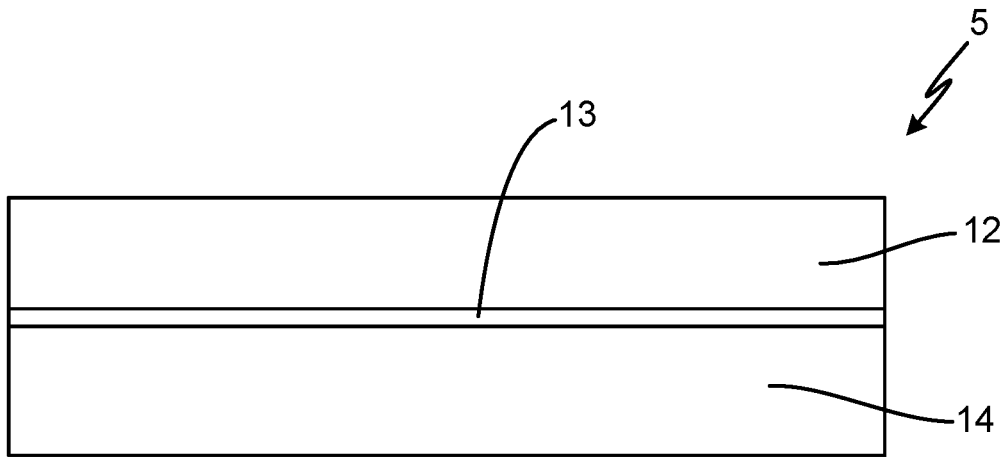
FIGS. 5A-5K are cross-sectional views that illustrate production steps of a MEMS pressure sensor.
Figure 5B:
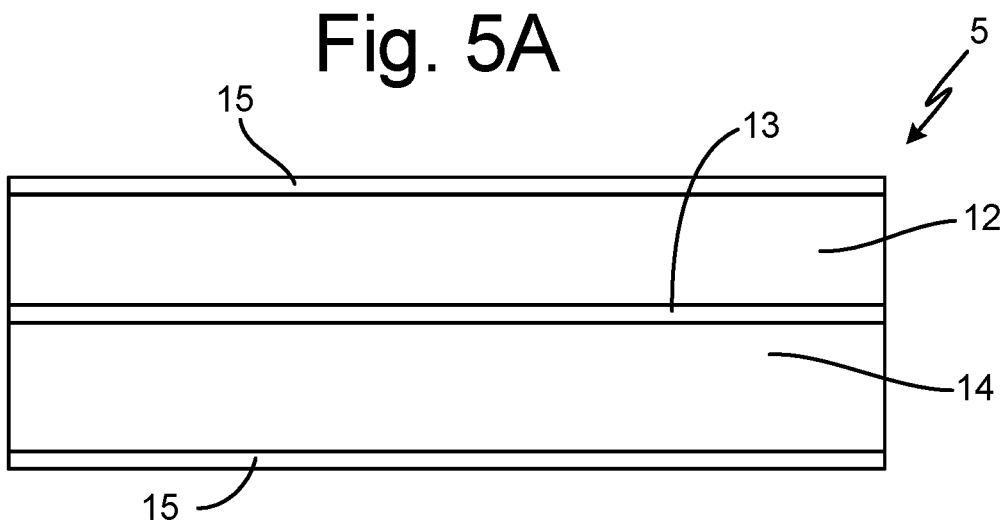
Figure 5C:
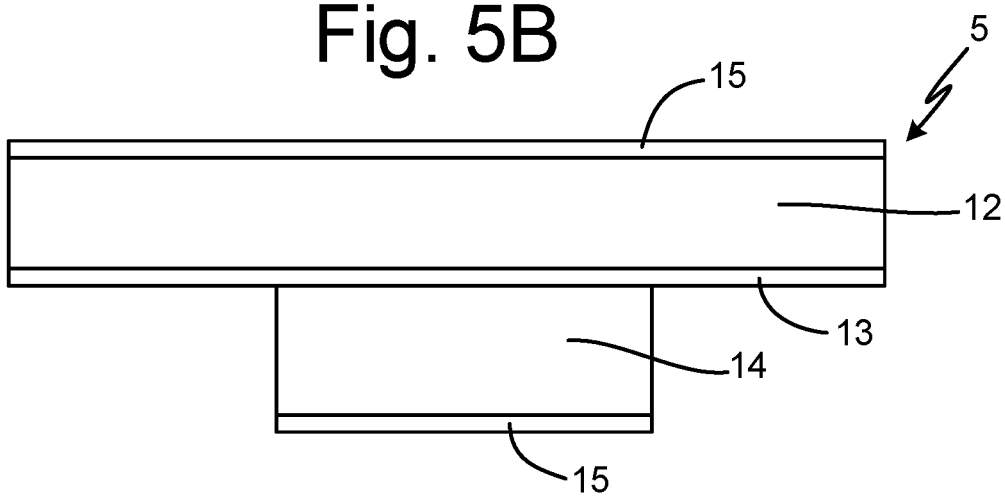
Figure 5D:
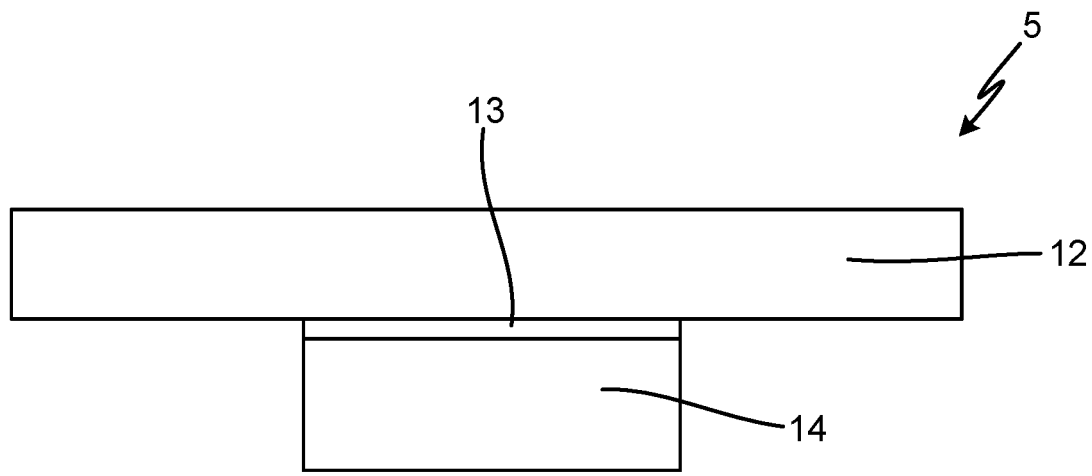

FIG. 4 is a flow diagram, and FIGS. 5A-5K are cross-sections, illustrating a method to form a MEMS pressure sensor. For ease of explanation, the method will be described with respect to forming MEMS pressure sensor 10 shown in FIG. 1. Procedure 90 is initiated by providing an SOI wafer as shown in FIG. 5A (step 92). SOI wafer 5 comprises top silicon layer 12 and bottom silicon layer 14 separated by insulating oxide layer 13. In the next step of the process, the top and bottom layers of SOI wafer 5 are oxidized to form insulating layer 13 on SOI wafer 5 as shown in FIG. 5B (step 94). A pillar is then formed by masking the bottom layer of wafer 5 and etching portions of the layer to form a pillar in bottom silicon layer 14 as shown in FIG. 5C (step 96). Etching may preferably be carried out by a dry reactive ion etch (DRIE). As shown in FIG. 5C, the etch is stopped by the middle oxide layer 13 in SOI wafer 5. The top and bottom oxide layers are then removed by etching as shown in FIG. 5D (step 98). Etching in this step may, for example, be carried out by wet etching in HF solution.

Figure 5E:
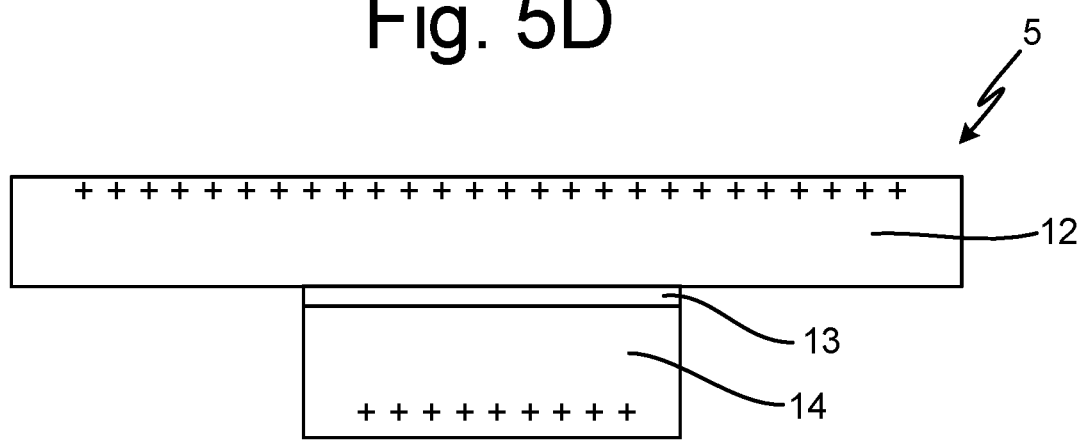

In the next step, the top and bottom surfaces of SOI wafer 5 are doped with boron or phosphor, depending by Si wafer type (Boron for P type and Phosphor for N type), as shown in FIG. 5E (step 100) for better surface conductivity and reducing the effective capacitor gap. Boron/phosphor may be implanted by ion implantation or by diffusion. This step completes the formation of top electrode plate 11 shown in FIG. 1.

Figure 5F:
Figure 5G:
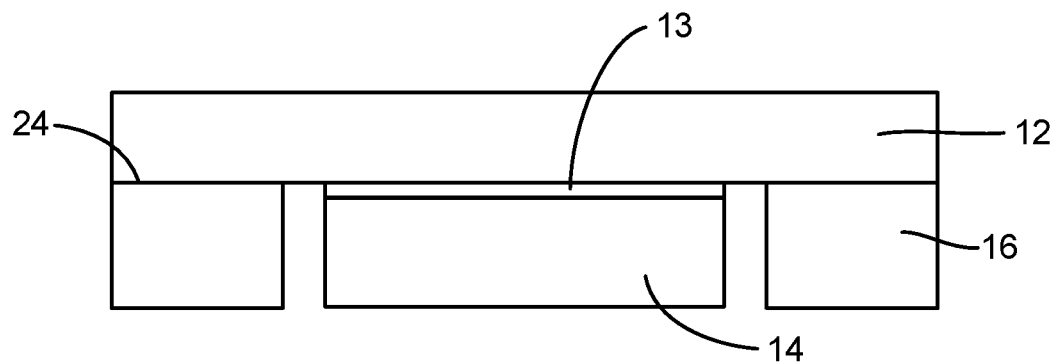

Quartz frame spacer 16 is then formed to act as a standoff in the MEMS sensor structure of the invention shown in FIG. 1. Quartz frame spacer 16 may be formed by ultrasonic machining and is shown in FIG. 5F (step 102). Quartz frame spacer 16 may then be bonded to implanted, etched, planarized SOI wafer 5 as shown in FIG. 5G (step 104). Bond interface 24 may be formed by a fusion bond.

Figure 5H:
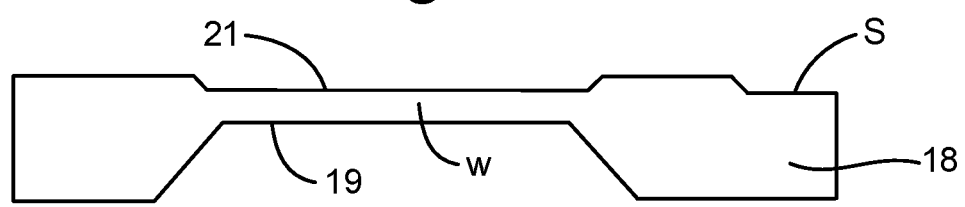

In the next step, silicon diaphragm 18 is then formed from a silicon wafer by etching depressions in the top and bottom of wafer 18 as shown in FIG. 5H. Thinning wafer 18 results in the formation of flexible web W. Step S shown on the side of wafer 18 forms a base for future deposition of an electrical contact (step 106).

Figure 5I:
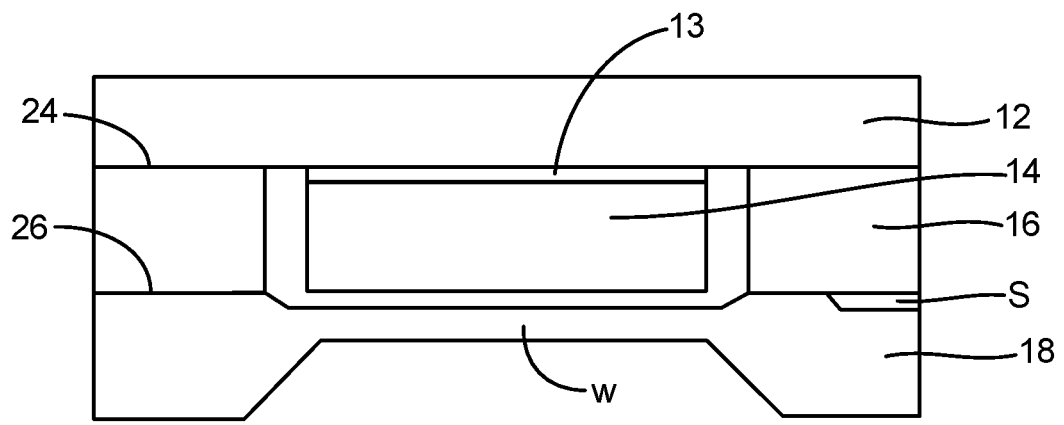
Figure 5J:
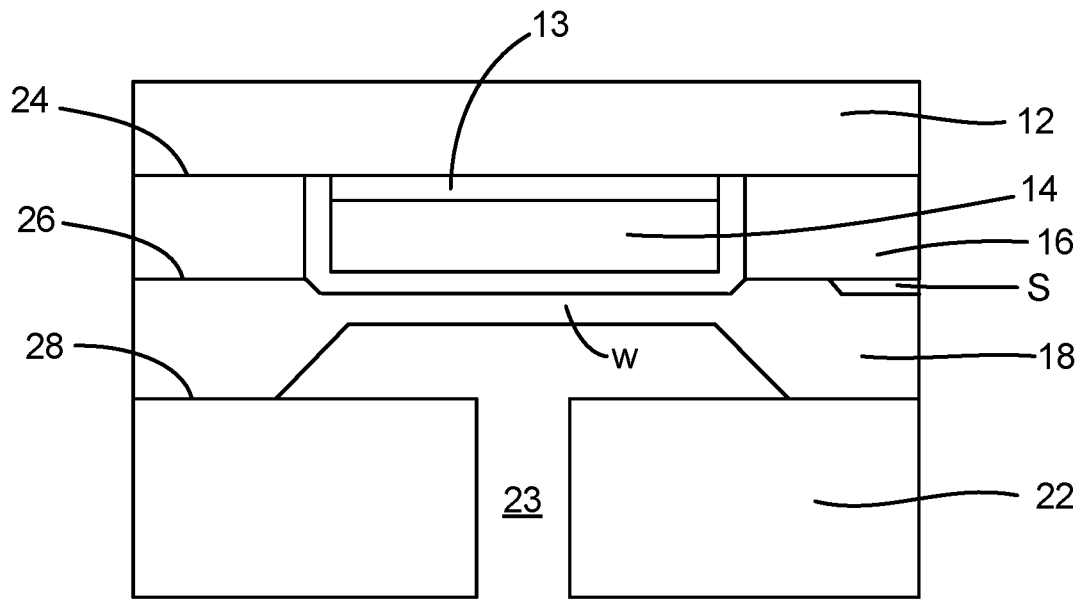

In the next step, the planarized bottom of quartz frame spacer 16 bonded to SOI wafer 5 is bonded to the planarized top of diaphragm 18 as shown in FIG. 5I (step 108). Bond 26 may be a fusion bond. The bonded structure containing top electrode plate 11 (see FIG. 1) and diaphragm 18 may then be bonded to silicon backing plate 22 with central hole 23 as shown in FIG. 5J (step 110). Bond 28 may also be a fusion bond.

Figure 5K:
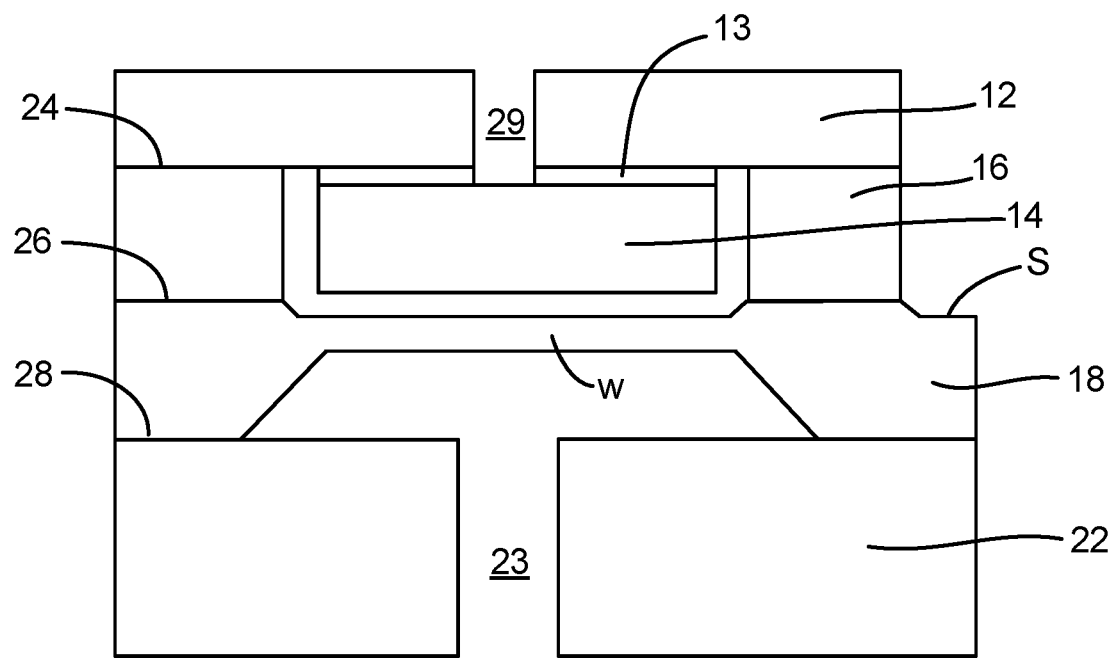

In the next step, top silicon layer 12 is masked and via 29 is formed by DRIE etching through top silicon layer 12 and oxide layer 13 as shown in FIG. 5K (step 112) Also shown in FIG. 5K, a portion of top electrode plate 11 is removed by dicing the section of top electrode plate 11 over side step S on diaphragm 18 to allow deposition of an electrode on side step S (step 114). Finally, electrodes are deposited in via 29 on top electrode plate 11 and on side step S on diaphragm 18 to create the structure of sensor 10 as shown in FIG. 1 (step 116).

Figure 6:
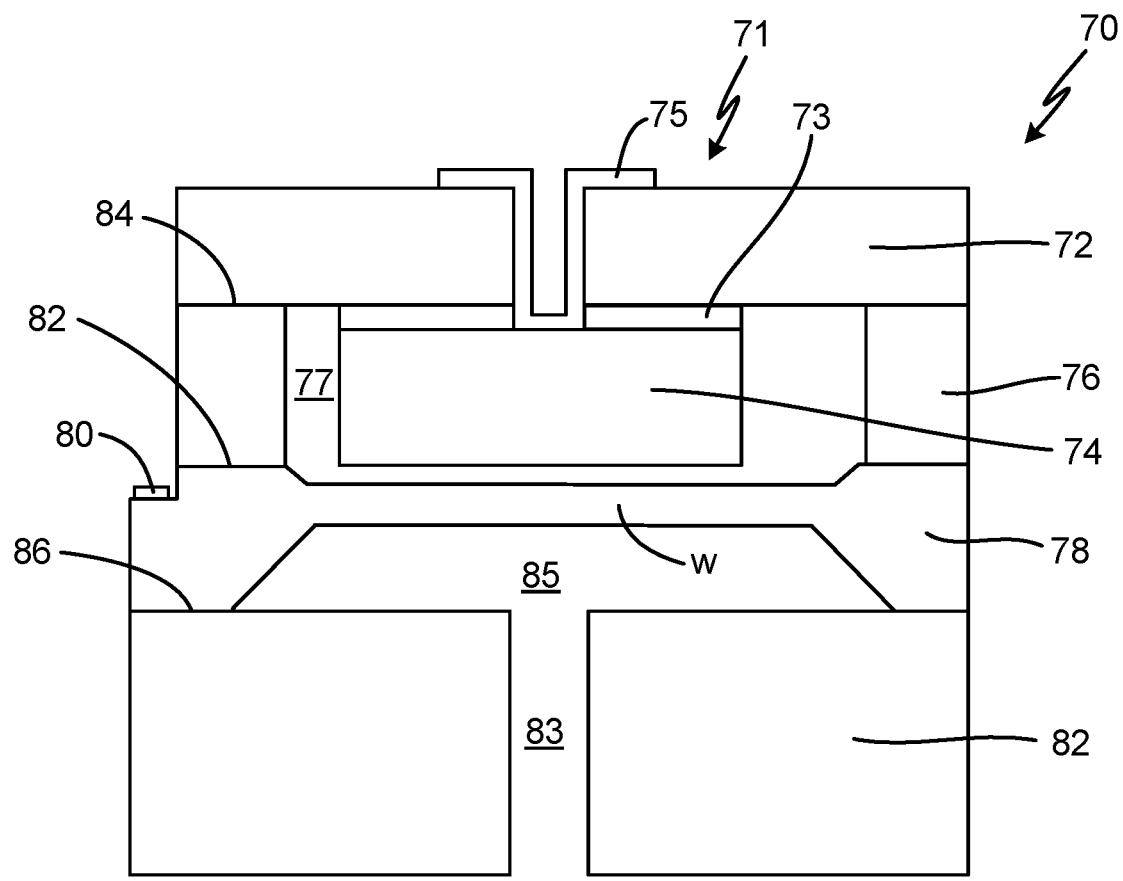
FIG. 6 is a cross-section of another embodiment of a MEMS pressure sensor.

In an embodiment of the present invention, the quartz spacer under the top SOI electrode plate in the MEMS pressure sensor of the invention is replaced by a glass spacer. This structure is illustrated in FIG. 6. MEMS pressure sensor 70 includes SOI electrode plate 71 comprising top silicon layer 72 and bottom silicon layer 74 separated by insulating oxide layer 73. Top silicon layer 72 is bonded to glass spacer frame 76 at bond interface 84 which, in turn, is bonded to silicon diaphragm 78 at bond interface 82. Glass spacer frame 76 is bonded to top silicon layer 72 and silicon diaphragm 78 by anodic or glass frit bonds known in the art. Silicon diaphragm 78 is bonded to silicon backing plate 82. Metal electrode 74 on electrode plate 71 and metal electrode 80 on silicon diaphragm 78 allow MEMS pressure sensor 70 to function as a capacitive pressure sensor, which may change output upon deflection of center web W due to pressure differences communicated through hole 83 in backing plate 82 and chamber 85 in silicon diaphragm 78. Chamber 77 may be evacuated and maintained under vacuum. The maximum operating temperature of MEMS pressure sensor 70 is less than the maximum operating temperature of MEMS sensors 10, 30, and 50 of the present disclosure as a result of the glass spacer in the structure, i.e. around 400° C. (752° F.).

Major benefits of the present invention include the high temperature stability of the sensor resulting from the exclusive use of quartz and silicon throughout the structure as well as the exclusive use of high temperature fusion bonds. A further benefit results from the vacuum sealed chamber which eliminates costly prior art vacuum packaging process.

Discussion of Possible Embodiments

The following are non-exclusive descriptions of possible embodiments in the present invention.

A MEMS pressure sensor may include a first plate with a central hole, a diaphragm bonded to the first plate around the rim of the first plate with the diaphragm positioned over the hole and an isolation frame bonded to a top of the diaphragm. The pressure sensor may further include the second plate with a central pillar bonded to isolation frame around a rim of the isolation frame to form a cavity such that an end of the pillar in the cavity is proximate the first surface of the diaphragm and wherein the diaphragm and second plate form a capacitive sensor that changes output upon deflection of the diaphragm relative to the second plate.

The MEMS pressure sensor of the preceding paragraph can optionally include, additionally and/or alternatively, any one or more of the following features, configurations, and/or additional components:

The first plate may be silicon.

The diaphragm may be silicon.

The isolation frame may be quartz.

The diaphragm and second plate may be electrically isolated.

The diaphragm may be bonded to the first plate by a fusion bond.

The isolation frame may be bonded to the diaphragm by a fusion bond.

The second plate may be bonded to the isolation frame by a fusion bond.

The cavity between the second plate, isolation frame, and diaphragm may be under a vacuum.

A method of forming a MEMS pressure sensor may include forming a first plate with a hole and forming a diaphragm by creating a depression in a first surface of a second plate. The method may further include bonding the first surface of the diaphragm to the first plate around a rim of the first plate and forming an isolation frame and bonding the isolation frame to the second surface of the diaphragm around a rim of the isolation frame. The method may further include forming a third plate with a pillar and a second surface of the third plate and bonding the second surface of the third plate to a third surface of the isolation frame such that an end of the pillar projects into a cavity that is formed and proximate the second surface of the diaphragm. The method may further include forming a first metal electrode on an exterior surface of the diaphragm and forming a second metal electrode on a fourth surface of the second plate to a form a capacitive sensor that changes output upon deflection of the diaphragm relative to the third plate due to pressure differences communicated through the diaphragm through the hole in the first plate.

A method of the preceding paragraph can optionally include, additionally and/or alternatively, anyone or more of the following features, configurations, and/or additional components:

The first plate may be silicon.

The diaphragm may be silicon and bonding the first surface of the diaphragm to the first plate may include fusion bonding.

The isolation frame may be quartz.

Bonding the isolation frame to the second surface of the silicon diaphragm may include fusion bonding.

The second plate may be silicon or SOI and forming the pillar in the second plate may be by dry reactive ion etching (DRIE).

Bonding the first surface of the second plate with the pillar to the second surface of the diaphragm may include fusion bonding.

The cavity between the second plate and the diaphragm may be evacuated.

A metal electrode formed on the exterior surface of the diaphragm may be Al, Ti, TiW, W, alloys or mixtures thereof.

The metal electrode formed on the second plate may be Al, Ti, TiW, W, alloys or mixtures thereof.

The invention claimed is:

1. A micro-electrical mechanical system (MEMS) pressure sensor comprising:
   a first plate with a central hole, wherein the first plate is composed of silicon;
   a diaphragm bonded to the first plate around a rim of the first plate with the diaphragm positioned over the central hole, wherein:
      the diaphragm defines a first diaphragm surface and a second diaphragm surface;
      the diaphragm first surface includes a first depression and is proximate the first plate with the central hole;
      the second diaphragm surface includes a second depression; and
      the diaphragm is composed of silicon;
   an isolation frame bonded to a top of the diaphragm, wherein the isolation frame is composed of quartz or glass; and
   a second plate with a central pillar projecting toward the second diaphragm surface, thereby defining a gap between a distal end of the central pillar and the second diaphragm surface, the second plate bonded to the isolation frame around a rim of the isolation frame to form a cavity, wherein the second plate is composed of silicon;
   wherein the gap between the diaphragm second surface and distal end of the central pillar form a capacitive sensor that changes output upon deflection of the diaphragm relative to the distal end of the central pillar.

2. The MEMS pressure sensor of claim 1, wherein the isolation frame is composed of quartz.

3. The MEMS pressure sensor of claim 1, wherein the diaphragm and second plate are electrically isolated.

4. The MEMS pressure sensor of claim 1, wherein the diaphragm is bonded to the first plate by a fusion bond.

5. The MEMS pressure sensor of claim 1, wherein the isolation frame is bonded to the diaphragm by a fusion bond, anodic bond, metal eutectic, or glass frit bond.

6. The MEMS pressure sensor of claim 1, wherein the second plate is bonded to the isolation frame by a fusion bond.

7. The MEMS pressure sensor of claim 1, wherein the cavity between the second plate, isolation frame, and diaphragm is under a vacuum.

8. A method of forming a micro-electrical mechanical system (MEMS) pressure sensor, the method comprising:
   forming a first plate with a central hole, wherein the first plate is composed of silicon;
   forming a diaphragm defining a first diaphragm surface and a second diaphragm surface by creating a first depression in a first surface of a second plate and creating a second depression in a second surface of the second plate, wherein the diaphragm is composed of silicon;
   bonding the first diaphragm surface to the first plate around a rim of the first plate with the first diaphragm surface proximate the first plate and the first depression positioned over the central hole;
   forming an isolation frame, wherein the isolation frame is composed of quartz or glass;
   bonding the isolation frame to the second diaphragm surface around a rim of the isolation frame;

forming a third plate with a central pillar projecting toward the diaphragm second surface, wherein the third plate is composed of silicon;

bonding a first surface of the third plate to a second surface of the isolation frame to form a cavity, thereby defining a gap between a distal end of the central pillar and the second diaphragm surface;

forming a first metal electrode on an exterior surface of the diaphragm; and forming a second metal electrode on a second surface of the third plate to form a capacitive sensor that changes output upon deflection of the diaphragm relative to the distal end of the central pillar due to pressure differences communicated to the diaphragm through the central hole in the first plate.

9. The method of claim 8, wherein bonding the first diaphragm surface to the first plate around a rim of the first plate comprises fusion bonding.

10. The method of claim 8, wherein the isolation frame is composed of quartz.

11. The method of claim 8, wherein bonding the isolation frame to the second diaphragm surface comprises fusion bonding, anodic bonding, metal eutectic bonding, or glass frit bonding.

12. The method of claim 8, wherein:
the second plate comprises silicon-on-insulator (SOI); and
forming the third plate with the central pillar is performed by dry reactive ion etching (DRIE).

13. The method of claim 8, wherein bonding the first surface of the third plate to the second surface of the isolation frame comprises fusion bonding.

14. The method of claim 8, further comprising evacuating the cavity.

15. The method of claim 8, wherein the first metal electrode comprises Al, Ti, TiW, W alloys or mixtures thereof.

16. The method of claim 8, wherein the second metal electrode comprises Al, Ti, TiW, W alloys or mixtures thereof.

* * * * *